(12) United States Patent
Caretti et al.

(10) Patent No.: US 10,763,995 B2
(45) Date of Patent: Sep. 1, 2020

(54) RECEIVER FOR WIRELESS COMMUNICATION NETWORKS

(71) Applicants: Telecom Italia S.p.A., Milan (IT); Politecnico di Torino, Turin (IT)

(72) Inventors: Marco Caretti, Turin (IT); Ivano Collotta, Turin (IT); Gian Michele Dell'aera, Turin (IT); Bruno Melis, Turin (IT); Marina Mondin, Turin (IT)

(73) Assignees: Telecom Italia S.p.A., Milan (IT); Politecnico di Torino, Turin (IT)

( * ) Notice: Subject to any disclaimer, the term of this patent is extended or adjusted under 35 U.S.C. 154(b) by 381 days.

(21) Appl. No.: 15/751,589

(22) PCT Filed: Aug. 11, 2015

(86) PCT No.: PCT/EP2015/068453
§ 371 (c)(1),
(2) Date: Feb. 9, 2018

(87) PCT Pub. No.: WO2017/025133
PCT Pub. Date: Feb. 16, 2017

(65) Prior Publication Data
US 2020/0204290 A1 Jun. 25, 2020

(51) Int. Cl.
*H04L 1/00* (2006.01)
*H03M 13/29* (2006.01)
(Continued)

(52) U.S. Cl.
CPC ......... *H04L 1/005* (2013.01); *H03M 13/1111* (2013.01); *H03M 13/2957* (2013.01);
(Continued)

(58) Field of Classification Search
CPC ..... H04L 1/005; H04L 1/0048; H04L 1/0631; H04L 2025/03426; H04L 25/03171;
(Continued)

(56) References Cited

U.S. PATENT DOCUMENTS

| 6,233,709 B1 | 5/2001 | Zhang et al. |
| 6,959,065 B2 | 10/2005 | Sparrman et al. |

(Continued)

FOREIGN PATENT DOCUMENTS

WO 2015/101384 A1 7/2015

OTHER PUBLICATIONS

Mar. 9, 2016—(WO) International Search Report and Written Opinion—App PCT/EP2015/068453.

*Primary Examiner* — Khanh C Tran
(74) *Attorney, Agent, or Firm* — Banner & Witcoff, Ltd.

(57) ABSTRACT

An iterative receiver receives a signal including useful and interfering signal components, and detects information carried thereon. The receiver includes at least one estimating unit receiving the signal and providing an estimate of each signal component, and at least two decoding and regenerating units, at each iteration, each decoding and regenerating unit decoding a respective one among the estimates and for regenerating the respective decoded estimate into a respective regenerated estimate. At each receiver iteration, the at least one estimating unit provides estimates based on regenerated estimates provided at a previous iteration. The receiver further includes a control unit determines activation or deactivation of each decoding and regenerating unit at each process step of a detection process dedicated to detection of the signal, and determines, for each process step, a respective number of allowed iterations for each decoding and regenerating unit whose activation has been determined for that process step.

14 Claims, 3 Drawing Sheets

(51) Int. Cl.
*H04L 25/03* (2006.01)
*H03M 13/11* (2006.01)

(52) U.S. Cl.
CPC ...... *H04L 1/0048* (2013.01); *H04L 25/03171* (2013.01); *H04L 25/03305* (2013.01)

(58) Field of Classification Search
CPC ............ H04L 25/03305; H03M 13/37; H03M 13/1111; H03M 13/2957; H03M 13/63
See application file for complete search history.

(56) References Cited

U.S. PATENT DOCUMENTS

| | | | |
|---|---|---|---|
| 7,051,268 B1 | 5/2006 | Sindhushayana et al. | |
| 7,415,001 B2 * | 8/2008 | Naguleswaran | H04B 1/10 370/252 |
| 7,783,958 B1 | 8/2010 | Eidson et al. | |
| 8,665,693 B1 | 3/2014 | Cheng et al. | |
| 8,869,010 B1 | 10/2014 | Sheng et al. | |
| 9,787,337 B2 | 10/2017 | Caretti et al. | |
| 2005/0174983 A1 | 8/2005 | Naguleswaran et al. | |
| 2009/0125793 A1 * | 5/2009 | Kishigami | H04L 25/0328 714/794 |
| 2010/0158161 A1 * | 6/2010 | Sambhwani | H03M 13/2957 375/341 |
| 2012/0063529 A1 * | 3/2012 | Choi | H04B 7/0891 375/267 |
| 2014/0153625 A1 * | 6/2014 | Vojcic | H03M 13/1131 375/224 |
| 2014/0369300 A1 | 12/2014 | Hu et al. | |
| 2015/0039964 A1 * | 2/2015 | Fonseka | H03M 13/253 714/756 |
| 2015/0131758 A1 | 5/2015 | Chen et al. | |
| 2015/0333942 A1 * | 11/2015 | Land | H04L 27/2003 375/279 |
| 2016/0013903 A1 * | 1/2016 | Kim | H04L 5/0048 370/329 |
| 2016/0036468 A1 * | 2/2016 | Eckert | H03M 13/6525 714/752 |
| 2017/0163379 A1 * | 6/2017 | Ito | H03M 13/612 |

* cited by examiner

RECEIVER FOR WIRELESS COMMUNICATION NETWORKS

BACKGROUND OF THE INVENTION

Field of the Invention

The present invention generally relates to a receiver for wireless communication networks. More particularly, the present invention relates to an iterative receiver providing cancellation of the co-channel interference coming from a serving network node (i.e. intra-cell interference) and/or from adjacent network nodes (inter-cell interference).

Overview of the Related Art

An evolution of the wireless communication networks, e.g. those compliant with LTE/LTE-Advanced standards, is the possibility of exploiting a combination of OFDM and MIMO techniques for transmission. According to OFDM technique, bits to be transmitted are split into bits sequences, then the bits sequences are modulated by separate and reciprocally orthogonal sub-carriers and multiplexed into OFDM symbols for transmission. According to MIMO technique, multiple OFDM symbols are transmitted/received via multiple transmitting/receiving antennas.

As known, spectral efficiency of modern wireless communication networks is severely limited by inter-cell interference and intra-cell interference, especially for users located at cell edges. For this reason, modern wireless communication networks provide transmission of the OFDM symbols by means of transmission techniques that exploits the availability of multiple transmitting/receiving antennas, such as SFBC ("Space Frequency Block Coding") or STBC ("Space Time Block Coding") transmission techniques (e.g., in case of two transmitting antennas), SFBC-FSTD ("SFBC-Frequency Switching Transmit Diversity") transmission technique (e.g., in case of four transmitting antennas), "Spatial Multiplexing" transmission technique, "Precoding" transmission technique, or any combination of these transmission techniques.

These transmission techniques require additional computational capabilities in order to correctly detect, at user equipment side, the transmitted bits.

This is exacerbated in modern scenarios, wherein the growing number of wireless communication networks users, as well as the growing demand for services requiring very high data traffic (such as internet, multimedia and real-time services) and the evolution of mobile applications, require higher and higher user data rates.

In the state of the art, different solutions (and/or receiver architectures implementing them) intended to improve detection of the transmitted bits are proposed.

U.S. Pat. No. 6,959,065, "Reduction of linear interference canceling scheme", discloses a system, method and apparatus for demodulating a received signal using a configurable receiver. The receiver performs the demodulation of a signal according to a selected interference cancellation demodulation scheme. The same receiver can be configured, by setting certain parameters, to behave as a successive interference cancellation scheme receiver, a parallel interference cancellation scheme receiver, or a hybrid interference cancellation scheme receiver. In another aspect, the receiver performs its demodulation operation using a single interference cancellation unit. In addition, despreading and respreading functions of the interference cancellation unit may be performed by the same processing element.

U.S. Pat. No. 8,665,693, "Uplink single carrier frequency division multiple access multiple-input multiple-output soft interference cancellation receiver" discloses system and method for "Soft Interference Cancellation" in receiving "Single Carrier Frequency Division Multiple Access" (SC-FDMA) "Multiple-Input Multiple Output" (MIMO) signals. A receiver with Mr antennas accepts multicarrier signals transmitted simultaneously, with N overlapping carrier frequencies. The receiver removes a cyclic prefix (CP), and fast Fourier transforms the multicarrier signal from each antenna, supplying Mr number of N-tone signals y. Using either parallel "Soft Interference Cancellation" or successive "Soft Interference Cancellation", interference is canceled in each of the Mr signals, and soft symbols are supplied for each of U layers. Interference is canceled using the parallel "Soft Interference Cancellation" process by parallel processing the U layers in an i-th iteration, in response to feedback from an (i−1)-th iteration. Alternatively, interference is canceled using the successive "Soft Interference Cancellation" process by sequentially processing the U layers in an i-th iteration, in the order of u0, u1, . . . , uU−1, using feedback generated from previously processed layers.

SUMMARY OF INVENTION

The Applicant has recognized that the number of turbo decoding iterations of a receiver has impact not only on the power consumption of the receiver (aspect much more important at the user equipment side) but also on the total latency of the physical layer processing (aspect relevant in today 4G LTE/LTE-A networks and, in perspective, much more important in future 5G networks), and that an optimal usage of a limited number of turbo decoding iterations in the receiver is of paramount importance to meet all the requirements in terms of throughput, latency and energy consumption.

In this respect, the Applicant believes that none of the cited prior art solutions is satisfactory.

Indeed, the Applicant has found that these prior art solutions provide a static allocation of the turbo decoding iterations.

In view of the above, the Applicant has tackled the problem of increasing the performance of a receiver while limiting the number of turbo decoding iterations, and, in order to achieve that, has devised a simple (i.e., low implementation complexity), effective and flexible receiver architecture that maximizes the throughput while operating in a situation where the processing complexity (e.g., expressed in terms of maximum number of turbo decoding iterations that can be performed) and related latency are constrained to an upper limit.

One or more aspects of the present invention are set out in the independent claims. Advantageous features of the present invention are indicated in the dependent claims, whose wording is enclosed herein verbatim by reference (with any advantageous feature being provided with reference to a specific aspect of the present invention that applies mutatis mutandis to any other aspect thereof).

More specifically, an aspect of the present invention relates to an iterative receiver for receiving a signal including useful and interfering signal components, and for detecting information carried thereon. The receiver comprises:

at least one estimating unit for receiving said signal and for providing an estimate of each signal component, at least two decoding and regenerating units, at each iteration each decoding and regenerating unit being arranged for decoding a respective one among said estimates, and for regenerating the respective decoded estimate into a respective regenerated estimate, at each iteration of said receiver said at least one estimating unit providing said estimates also based on the regenerated estimates provided at a previous iteration, and a control unit for determining activation or deactivation of each decoding and regenerating unit at each process step of a detection process dedicated to detection of said signal, and for determining, for each process step, a respective number of allowed iterations for each decoding and regenerating unit whose activation has been determined for that process step, each number of allowed iterations being determined according to radio measurements of the signal components and such that an overall number of allowed iterations over the detection process does not exceed a maximum allowed number of iterations.

According to an embodiment of the present invention, said maximum allowed number of iterations is based on at least one among an admitted throughput, an admitted latency and an admitted energy consumption of the receiver.

According to an embodiment of the present invention, each decoding and regenerating unit comprises a switching unit for switching the respective decoding and regenerating unit between a first configuration wherein bit-level decoding is performed and a second configuration wherein symbol-level decoding is performed, the control unit being further arranged for determining, for each process step, the first or second configuration of the each decoding and regenerating unit whose activation has been determined for that process step.

According to an embodiment of the present invention, each decoding and regenerating unit further comprises a respective buffer unit for storing, at each iteration, soft information from bit-level decoding of the respective estimate, at each iteration each decoding and regenerating unit in the first configuration being arranged for carrying out said bit-level decoding also based on a most updated version of said soft information.

According to an embodiment of the present invention, each decoding and regenerating unit in the second configuration is arranged for carrying out said symbol-level decoding also based on a most updated version of said soft information.

According to an embodiment of the present invention, the control unit is further arranged for determining, at each iteration of an activated decoding and regenerating unit, correct detection of the respective signal component, and in case that correct detection of the signal component with a lower number of allowed iterations is determined, for distributing the saved number of allowed iterations among the remaining signal components to be detected over the same detection process.

According to an embodiment of the present invention, in case that, at the end of the detection process, not correct detection of the at least one signal component is determined, the control unit is further configured to send a re-transmission request for the non-correctly detected signal component.

According to an embodiment of the present invention, the control unit is arranged for determining, at each iteration, correct signal detection according to a "Cyclic Redundancy Code" associated with the signal component.

According to an embodiment of the present invention, the iterative receiver is adapted to be used at a user equipment side of a wireless communication network, the control unit being further arranged for stopping the detection process of each decoding and regenerating unit for the received signal when correct detection of each signal component from a network node serving the user equipment and directed to the user equipment is determined.

According to an embodiment of the present invention, the iterative receiver is adapted to be used at network node side of a wireless communication network, the control unit being further arranged for stopping the detection process of each decoding and regenerating unit for the received signal when correct detection of each signal component from any user equipment served by said network node and directed towards said network node is determined.

According to an embodiment of the present invention, said radio measurements comprise power measurements of the signal components.

According to an embodiment of the present invention, said at least one estimating unit is based on "MMSE-Interference Rejection Combining" algorithm.

Another aspect of the present invention relates to a method comprising:

receiving a signal including useful and interfering signal components, and providing an estimate of each signal component, at each process step of a detection process intended to detection of information carried on the signal, processing at least one signal component by iteratively decoding the respective estimate and regenerating the respective decoded estimate into a respective regenerated estimate, at each iteration said providing said estimates being also based on the regenerated estimates provided at a previous iteration, and determining, for each process step of the detection process, the at least one signal component to be processed and a number of allowed iterations for each signal component intended to be processed at that process step, each number of allowed iterations being determined according to radio measurements of the signal components and such that an overall number of allowed iterations over the detection process does not exceed a maximum allowed number of iterations.

According to an embodiment of the present invention, said maximum allowed number of iterations is based on at least one among an admitted throughput, an admitted latency and an admitted energy consumption that are admitted for the method.

According to an embodiment of the present invention, the method further comprises determining, for each process step, a bit-level decoding or a symbol-level decoding for each signal component intended to be processed at that process step.

According to an embodiment of the present invention, the method further comprises storing, at each iteration, soft information from bit-level decoding of the respective estimate, at each iteration said bit-level decoding being also based on a most updated version of said soft information.

According to an embodiment of the present invention, said symbol-level decoding is also based on a most updated version of said soft information.

According to an embodiment of the present invention, the method further comprises:

determining, at each iteration, correct detection of the respective signal component, and in case that correct detection of the signal component with a lower number of allowed iterations is determined, distributing the saved number of allowed iterations among the remaining signal components to be detected over the same detection process.

According to an embodiment of the present invention, the method further comprises:

in case that, at the end of the detection process, not correct detection of the at least one signal component is determined, sending a re-transmission request for the non-correctly detected signal component.

According to an embodiment of the present invention, the method further comprises determining, at each iteration, correct signal detection according to a "Cyclic Redundancy Code" associated with the signal component.

According to an embodiment of the present invention, said radio measurements comprise power measurements of the signal components.

According to an embodiment of the present invention, said providing an estimate of each signal component is based on "MMSE-Interference Rejection Combining" algorithm.

BRIEF DESCRIPTION OF THE ANNEXED DRAWINGS

These and other features and advantages of the present invention will be made apparent by the following description of some exemplary and non-limitative embodiments thereof. For its better intelligibility, the following description should be read making reference to the attached drawings, wherein.

DETAILED DESCRIPTION OF PREFERRED EMBODIMENTS OF THE INVENTION

Figure 1:
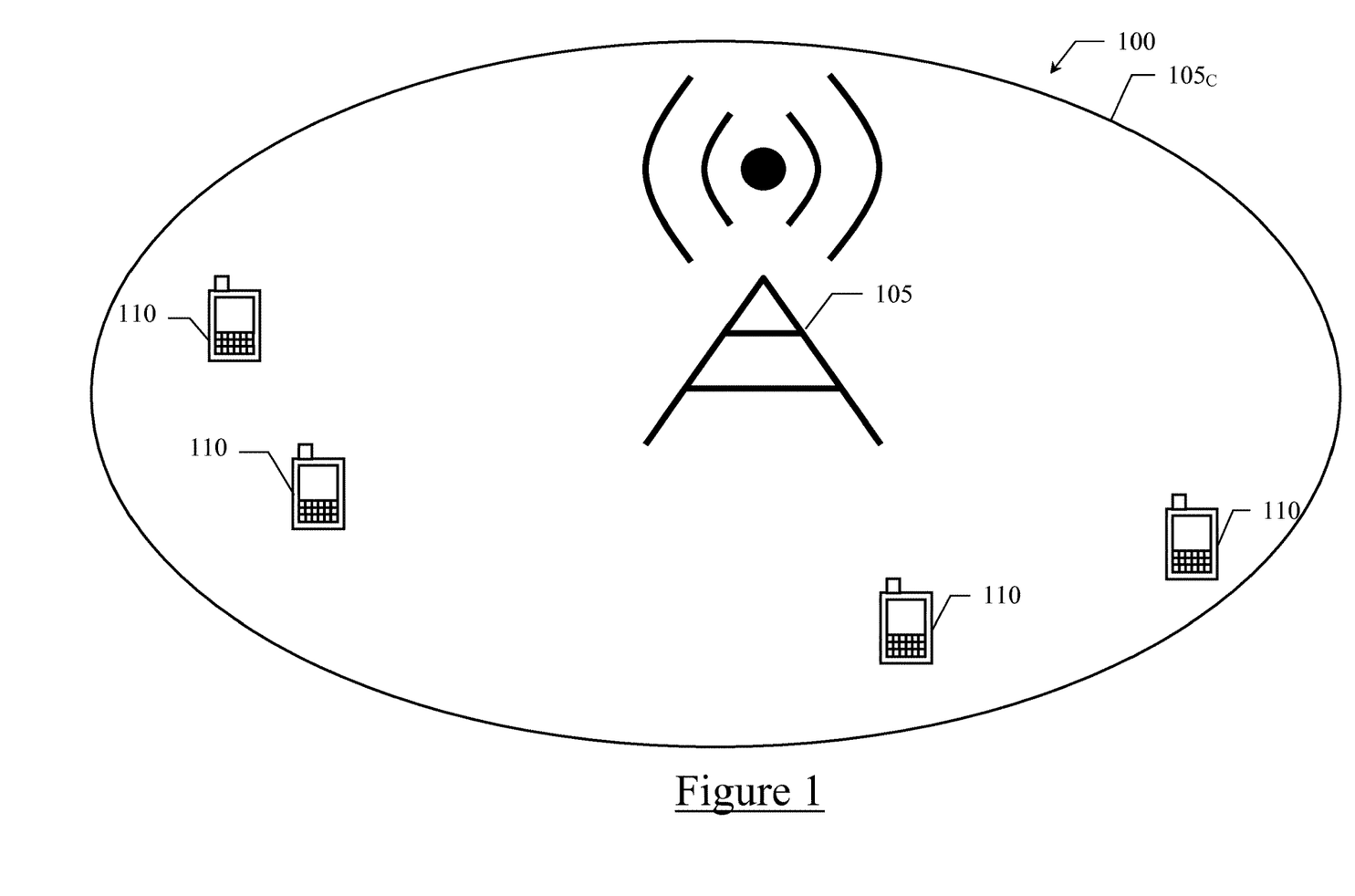
FIG. 1 schematically shows a wireless communication network wherein the present invention can be applied.

With reference to the drawings, a wireless communication network 100 wherein the present invention can be applied is schematically illustrated in FIG. 1. The wireless communication network 100 comprises one (as illustrated) or more transceiver stations (hereinafter, network nodes), such as the network node 105.

Each network node, such as the network node 105, is configured to provide radio coverage over a respective geographic area, also referred to as network cell, such as the network cell 105c, for allowing user equipment (e.g., mobile phones) within a respective network cell (such as the illustrated user equipment 110 within the network cell 105c) to exchange Radio Frequency (RF) signals enabling data traffic services (e.g., web browsing, e-mailing, voice, and/or multimedia services).

Both the network node 105 and the user equipment 110 within the network cell 105c comprise respective transmitting/receiving antennas (not shown) for mutual exchange of the RF signals, and suitable processing circuitry (not shown) for properly processing them.

Broadly speaking, processing circuitry comprises a receiver for converting the received RF signals into corresponding base-band signals and processing them for information bit detection (i.e. for extraction of the information bits carried thereon), and a transmitter for processing and base-band/RF converting signals to be transmitted via the respective transmitting antenna/antennas.

The wireless communication network 100 is for example compliant with the 3GPP LTE/LTE-Advanced standard. However, the principles of the present invention generally apply to any wireless communication network based on multicarrier transmission techniques—such as transmission techniques based on "Orthogonal Frequency Division Multiplexing" (OFDM) technique—and on "Multiple Input Multiple Output" (MIMO) technique.

According to OFDM technique, bits to be transmitted (including both the information bits and control bits, such as redundancy bits) are split into bits sequences, thereafter the bits sequences are modulated by separate and reciprocally orthogonal sub-carriers and multiplexed into OFDM symbols for transmission.

OFDM technique is based on radio resources allocation in time/frequency domain. Considering for example the 3GPP LTE/LTE-Advanced standard, in time domain radio resources are distributed every "Transmission Time Interval" (TTI), each one lasting 1 ms (sub-frame) and comprising two time slots of 0.5 ms, whereas in frequency domain the whole bandwidth is divided into a plurality of 180-kHz sub-channels (each one corresponding to N=12 adjacent and equally spaced sub-carriers). A radio resource comprising a number of OFDM symbols (e.g., seven) spanning over one time slot in time domain and twelve adjacent sub-carriers in frequency domain is referred to as "Physical Resource Block" (PRB), and corresponds to the smallest radio resource that can be allocated to a user equipment 110 for data transmission.

According to MIMO technique, the OFDM symbols are transmitted/received via multiple transmitting/receiving antennas at both network node 105 and user equipment 110 sides, which improves communication performance without additional bandwidth or increased transmission power. OFDM symbols transmission over multiple transmitting antennas can be achieved, for example, by means of SFBC ("Space Frequency Block Coding") or STBC ("Space Time Block Coding") transmission techniques (e.g., in case of two transmitting antennas), by means of SFBC-FSTD ("SFBC-Frequency Switching Transmit Diversity") transmission technique (e.g., in case of four transmitting antennas), by means of "Spatial Multiplexing" transmission technique, by means of "Precoding" transmission technique, or by means of any combination of these transmission techniques.

Figure 2:
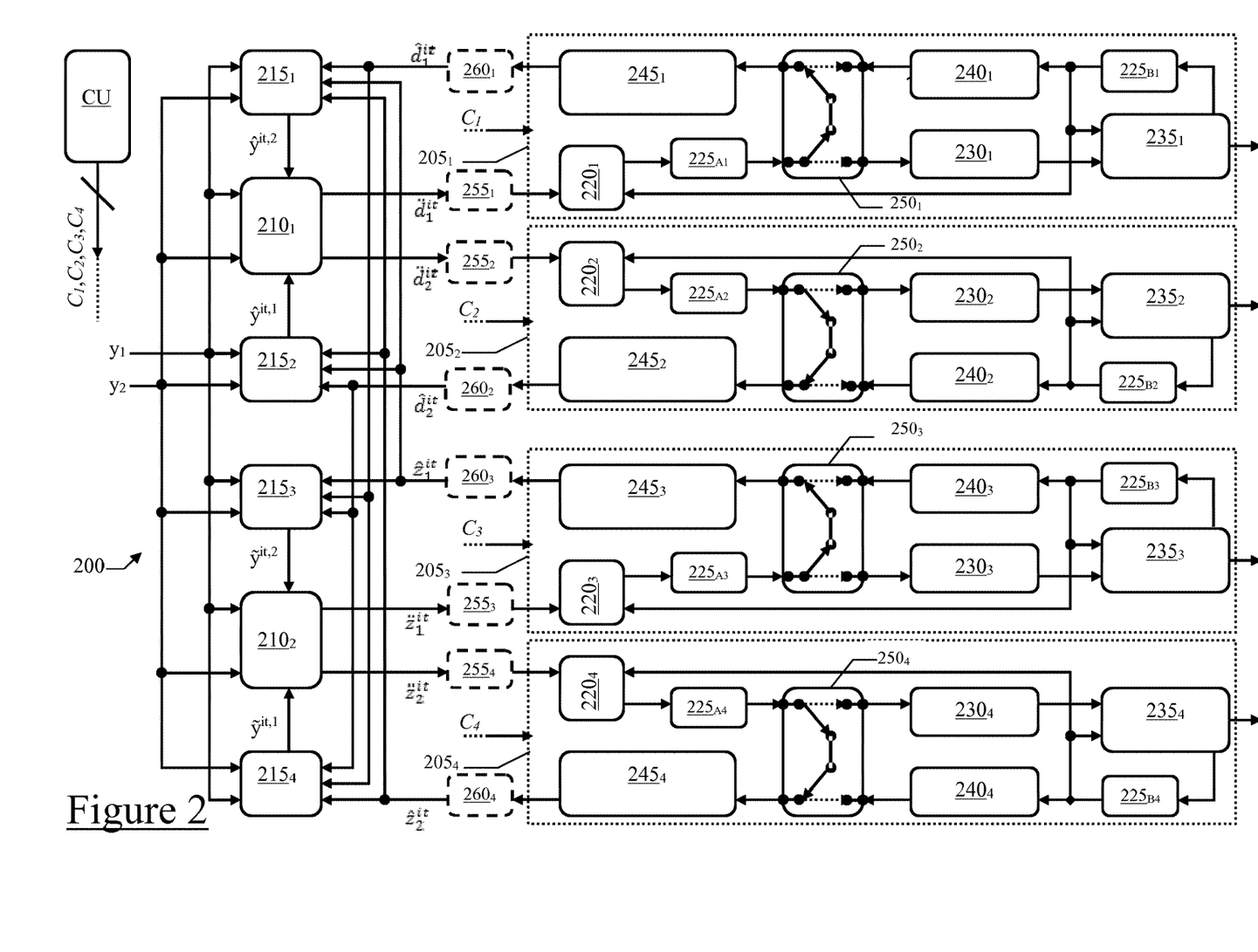
FIG. 2 schematically shows a receiver for said wireless communication network, according to an embodiment of the present invention, and FIG. 3 schematically shows an activity diagram illustrating a detection process carried out by said receiver according an embodiment of the present invention.

With reference now to FIG. 2, it schematically shows, according to an embodiment of the present invention, a receiver 200 adapted to be used in the wireless communication network 100. For the sake of conciseness, only a part of the receiver 200 relevant for understanding the present invention (i.e., the base-band part) has been illustrated and will be discussed herebelow, with the other, well known parts of the receiver 200 (e.g., antennas, RF filters, duplexers, RF/IF front-end, mixers for frequency down-conversion, A/D converters) that have been intentionally omitted or simplified.

The receiver 200 is applicable both at the user equipment 110 side (i.e., in the downlink) and at the network node 105 side (i.e., in the uplink) however, as will be better understood from the following discussion, receiver 200 advantages are more apparent when the receiver 200 is applied at an entity, such as the user equipment 110, which is more likely affected by computational constraints.

Basically, the receiver 200 is an iterative receiver configured to receive a signal including both useful and interfering signal components, and for detecting (i.e., extracting) the information (e.g., the information bits) carried thereon by means of a number of iterations. For example, in the considered scenario of a wireless communication network 100 compliant with the 3GPP LTE/LTE-Advanced standard, each signal component within the received signal is a formatted (e.g., encoded, modulated and precoded) version of a respective codeword (more specifically, in the 3GPP terminology a codeword represents a data stream that, under the control of the "Adaptive Modulation and Coding" procedure, is independently encoded, modulated and precoded for transmission).

The useful signal components comprise the signal components received at the user equipment 110 from the (serving) network node 105 (downlink) or the signal components received at the network node 105 from the (served) user equipment 110 (uplink).

The interfering signal components may comprise:
  intra-cell interfering signal components (in case of MU ("Multi User")-MIMO transmission), i.e. the signal components received at the same (serving) network node 105 from a different user equipment 110 allocated on same radio resources (and, hence, acting as interfering user equipment), or the signal components from the same (serving) network node 105 received at a different user equipment 110 allocated on same radio resources (and, hence, acting as interfering user equipment);
  inter-cell interfering signal components, i.e. the signal components received at the user equipment 110 from network nodes adjacent the (serving) network node 105 (and, hence, acting as interfering network nodes), or the signal components received at the network node 105 from user equipment served by adjacent network nodes (and, hence, acting as interfering user equipment).

As better discussed in the following, the receiver 200 is preferably configured to detect the information bits of at least the useful signal components. Advantageously, the receiver 200 may be configured to detect the information bits only of the useful signal components (e.g., when the receiver 200 is arranged at the user equipment 110 side: indeed, in such a case, both the intra-cell and inter-cell interfering signal components are not directed to that user equipment 110, and hence they are signal components not of interest for that user equipment 110) or the information bits of both the useful and the intra-cell interfering signal components (e.g., when the receiver 200 is arranged at the network node 105 side: indeed, in such a case, the useful signal components and the intra-cell interfering signal components come from different user equipment 110 but are directed to the same network node 105 serving them, hence they are signal components of interest for that serving network node 105). However, in both cases, the receiver 200 may be configured to detect also the information bits of the inter-cell interfering signal components (e.g., for channel estimates or other network parameter estimates). Embodiments are not excluded wherein the receiver 200 is configured to detect the information bits of only the intra-cell interfering signal components or of only the inter-cell interfering signal components (e.g., for channel estimates or other network parameter estimates).

In the following, for the sake of ease, the wireless communication network 100 is assumed to be a synchronous wireless communication network (i.e. whose all network nodes that are frame synchronized), and the receiver 200 is assumed to be aware of all information required for detecting the information bits of each (intra-cell and/or inter-cell) interfering signal component. For each interfering signal component, said information may comprise at least one among:

allocated radio resources (i.e., sub-frames, PRB)
"Modulation and Coding Scheme" (MCS)
scrambling sequence
transmission technique (i.e., Transmission Mode)
precoding vector or matrix used at the transmitter (when precoding transmission technique, as herein assumed, or when any other transmission technique including precoding is used);
"Reference Signals" (RS) of the interfering network node or of the interfering user equipment (i.e., RS position, RS sequence, number of antenna ports, power boost level)

Each one of said information may be acquired by the receiver 200 by means of "Network Assisted Interference Cancellation and Suppression" (NAICS) signaling (especially when the receiver 200 is applied at user equipment 110 side), or estimated at the receiver 200 (e.g., by means of blind detection techniques).

As visible in the figure, the receiver 200 comprises two or more (e.g., four) decoding and regenerating units (hereinafter, D/R units) $205_1, 205_2, 205_3, 205_4$, each one for processing a respective signal component (as discussed below).

As visible in the figure, the receiver 200 also comprises a control unit CU for controlling operation of the D/R units $205_1, 205_2, 205_3, 205_4$, e.g. by means of corresponding control signals $C_1, C_2, C_3, C_4$.

In the following, the receiver 200 will be discussed by assuming that it is equipped with two receiving antennas, and that four OFDM symbols $x=[x_1\ x_2]^T$ and $z=[z_1\ z_2]^T$ (corresponding to the useful and interfering signal components, respectively) are received on the k-th OFDM subcarrier.

The channel characteristics are supposed to be known by the receiver 200, including the MIMO channel matrix over all the OFDM subcarriers.

The received signal $y=[y_1\ y_2]^T$ after OFDM demodulation can be expressed as:

$$y_1 = H_{c11}x_1 + H_{c12}x_2 + K_{11}z_1 + K_{12}z_2 + n_1$$

$$y_2 = H_{c21}x_1 + H_{c22}x_2 + K_{21}z_1 + K_{22}z_2 + n_2$$

wherein:
  $H_c$ is the MIMO 2×2 channel matrix of the communication channel between the transmitter that transmits the useful signal component (hereinafter, useful transmitter, not shown) and the receiver 200 that receives them,
  K is the MIMO 2×2 channel matrix of the communication channel between the transmitter that transmits the interfering signal components (hereinafter, interfering transmitter, not shown) and the receiver 200 that receives them,
  $n_1$ and $n_2$ are samples of uncorrelated Gaussian processes with power $P_n$.

Let the variables $p_1$ and $p_2$, which take into account both the inter-cell and intra-cell interferences and thermal noise terms, be defined as:

$$p_1 = K_{11}z_1 + K_{12}z_2 + n_1$$

$$p_2 = K_{21}z_1 + K_{22}z_2 + n_2$$

so that $$y = H_c x + p$$

$$p = Kz + n$$

Moreover, defining the matrix H as:

$$H = H_c F$$

where F is the precoding matrix used at the useful transmitter, it follows that $$y = Hd + p$$

where $d = [d_1 \; d_2]^T$ represent the transmitted OFDM symbols before precoding.

The receiver 200 comprises one or more (e.g., two) estimating units 210₁,210₂ (preferably based on "MMSE-Interference Rejection Combining" (MMSE-IRC) algorithm) for receiving the signal $y = [y_1 \; y_2]^T$ and for providing, at each iteration, an estimate of each signal component (hereinafter referred to as useful component estimates $\ddot{d}^{it} = [\ddot{d}_1^{it} \; \ddot{d}_2^{it}]^T$ and interfering component estimates $\ddot{z}^{it} = [\ddot{z}_1^{it} \; \ddot{z}_2^{it}]^T$ respectively) to a respective D/R unit 205₁,205₂,205₃, 205₄—the superscript $(.)^{it}$ denoting the iteration number. Preferably, said estimating units 210₁,210₂ are symbol estimating unit, i.e. each useful component estimate $\ddot{d}^{it} = [\ddot{d}_1^{it} \; \ddot{d}_2^{it}]^T$ and each interfering component estimate $\ddot{z}^{it} = [\ddot{z}_1^{it} \; \ddot{z}_2^{it}]^T$ is provided in the form of symbols (e.g., OFDM symbols).

At each iteration, each D/R unit 205₁,205₂,205₃,205₄ is arranged for decoding the respective component estimate $\ddot{d}_1^{it}, \ddot{d}_2^{it}, \ddot{z}_1^{it}, \ddot{z}_2^{it}$, and for regenerating the respective decoded estimate into a respective regenerated component estimate $\hat{d}_1^{it}, \hat{d}_2^{it}, \hat{z}_1^{it}, \hat{z}_2^{it}$.

At each iteration, the estimating units 210₁,210₂ provide the component estimates $\ddot{d}_1^{it}, \ddot{d}_2^{it}, \ddot{z}_1^{it}, \ddot{z}_2^{it}$ also based on the regenerated component estimates $\hat{d}_1^{it}, \hat{d}_2^{it}, \hat{z}_1^{it}, \hat{z}_2^{it}$ provided at a previous iteration. In order to achieve that, the receiver 200 preferably comprises two or more (e.g., four) interference cancelling units 215₁,215₂,215₃,215₄ for providing an interference-free signal estimate $\hat{y}^{it,2}$ to the estimating unit 210₁, an interference-free signal estimate $\hat{y}^{it,1}$ to the estimating unit 210₁, an interference-free signal estimate $\tilde{y}^{it,2}$ to the estimating unit 210₂ and an interference-free signal estimate $\tilde{y}^{it,1}$ to the estimating unit 210₂, respectively, e.g. according to the following (not limiting) equations:

$$\hat{y}^{it,1} = \begin{bmatrix} \hat{y}_1^{it,1} \\ \hat{y}_2^{it,1} \end{bmatrix} = \begin{bmatrix} y_1 \\ y_2 \end{bmatrix} - \begin{bmatrix} H_{12} \\ H_{22} \end{bmatrix} \hat{d}_2^{it-1} - K\hat{z}^{it-1} \quad \text{(v)}$$

$$\hat{y}^{it,2} = \begin{bmatrix} \hat{y}_1^{it,2} \\ \hat{y}_2^{it,2} \end{bmatrix} = \begin{bmatrix} y_1 \\ y_2 \end{bmatrix} - \begin{bmatrix} H_{11} \\ H_{21} \end{bmatrix} \hat{d}_1^{it-1} - K\hat{z}^{it-1} \quad \text{(vi)}$$

$$\tilde{y}^{it,1} = \begin{bmatrix} \tilde{y}_1^{it,1} \\ \tilde{y}_2^{it,1} \end{bmatrix} = \begin{bmatrix} y_1 \\ y_2 \end{bmatrix} - \begin{bmatrix} K_{12} \\ K_{22} \end{bmatrix} \hat{z}_2^{it-1} - H\hat{d}^{it-1} \quad \text{(vii)}$$

$$\tilde{y}^{it,2} = \begin{bmatrix} \tilde{y}_1^{it,2} \\ \tilde{y}_2^{it,2} \end{bmatrix} = \begin{bmatrix} y_1 \\ y_2 \end{bmatrix} - \begin{bmatrix} K_{11} \\ K_{21} \end{bmatrix} \hat{z}_1^{it-1} - H\hat{d}^{it-1} \quad \text{(viii)}$$

In other words:
- the interference cancelling unit 215₁ is configured to receive the regenerated component estimates $\hat{d}_1^{it}, \hat{z}_1^{it}, \hat{z}_2^{it}$, and to provide to the estimating unit 210₁ the interference-free signal estimate $\hat{y}^{it,2}$, the latter representing the signal estimate of the signal from the first transmitter cleaned by the inter-stream interference and the inter-cell interference caused by the second transmitter (the interference-free signal estimate $\hat{y}^{it,2}$ corresponding to the useful component (symbol) estimate $\ddot{d}_2^{it}$ that will be output from the estimating unit 210₁);
- the interference cancelling unit 215₂ is configured to receive the regenerated component estimates $\hat{d}_2^{it}, \hat{z}_1^{it}, \hat{z}_2^{it}$, and to provide to the estimating unit 210₁ the interference-free signal estimate $\hat{y}^{it,1}$, the latter representing the signal estimate of the signal from the first transmitter cleaned by the inter-stream interference and the inter-cell interference caused by the second transmitter (the interference-free signal estimate $\hat{y}^{it,1}$ corresponding to the useful component (symbol) estimate $\ddot{d}_1^{it}$ that will be output from the estimating unit 210₁);
- the interference cancelling unit 215₃ is configured to receive the regenerated component estimates $\hat{d}_1^{it}, \hat{d}_2^{it}, \hat{z}_1^{it}$, and to provide to the estimating unit 210₂ the interference-free signal estimate $\tilde{y}^{it,2}$, the latter representing the signal estimate of the signal received from the second transmitter cleaned by the inter-stream interference and the inter-cell interference caused by the first transmitter (the interference-free signal estimate $\tilde{y}^{it,2}$ corresponding to the useful component (symbol) estimate $\ddot{z}_2^{it}$ that will be output from the estimating unit 210₂);
- the interference cancelling unit 215₄ is configured to receive the regenerated component estimates $\hat{d}_1^{it}, \hat{d}_2^{it}, \hat{z}_2^{it}$ and to provide to the estimating unit 210₂ the interference-free signal estimate $\tilde{y}^{it,1}$, the latter representing the signal estimate of the signal received from the first transmitter cleaned by the inter-stream interference and the inter-cell interference caused by the second transmitter (the interference-free signal estimate $\tilde{y}^{it,1}$ corresponding to the useful component (symbol) estimate $\ddot{z}_1^{it}$ that will be output from the estimating unit 210₂);

In view of that, the useful $\ddot{d}^{it} = [\ddot{d}_1^{it} \; \ddot{d}_2^{it}]^T$ and interfering $\ddot{z}^{it} = [\ddot{z}_1^{it} \; \ddot{z}_2^{it}]^T$, component estimates provided by the estimating units 210₁,210₂ can be expressed as follows:

$$\ddot{d}_1^{it} = \begin{bmatrix} H_{11} \\ H_{21} \end{bmatrix}^H (HQ_1^{it}H^H + (P_z/P_x)KS^{it}K^H + (P_n/P_x)I)^{-1} \hat{y}^{it,1} \quad \text{(i)}$$

$$\ddot{d}_2^{it} = \begin{bmatrix} H_{12} \\ H_{22} \end{bmatrix}^H (HQ_2^{it}H^H + (P_z/P_x)KS^{it}K^H + (P_n/P_x)I)^{-1} \hat{y}^{it,2} \quad \text{(ii)}$$

$$\ddot{z}_1^{it} = \begin{bmatrix} K_{11} \\ K_{21} \end{bmatrix}^H (HQ^{it}H^H + (P_z/P_x)KS_1^{it}K^H + (P_n/P_x)I)^{-1} \tilde{y}^{it,1} \quad \text{(iii)}$$

$$\ddot{z}_2^{it} = \begin{bmatrix} K_{12} \\ K_{22} \end{bmatrix}^H (HQ^{it}H^H + (P_z/P_x)KS_2^{it}K^H + (P_n/P_x)I)^{-1} \tilde{y}^{it,2} \quad \text{(iv)}$$

wherein:
Q and S are weighting matrices, and
$P_x$ and $P_z$ represent (e.g., mean squared values) of the powers of the transmitted pre-coded OFDM symbols x and z, respectively.

Back to the figure, each D/R unit 205₁,205₂,205₃,205₄ preferably comprises a respective soft demodulation unit 220₁,220₂,220₃,220₄ providing LLR ("Log Likelihood Ratio")-based estimates of the OFDM symbols (or soft symbols), respective buffer units 225₍₄₁₋₄₄₎,225₍B1-B4₎, a respective de-interleaver unit 230₁,230₂,230₃,230₄, a respective decoder unit 235₁,235₂,235₃,235₄ (e.g., a turbo decoder unit implemented by using a 8-state parallel concatenated turbo code) providing LLR ("Log Likelihood Ratio")-based estimates of the information and redundancy bits (hereinafter, soft bits), a respective interleaver unit 240₁,240₂,240₃,240₄, and a respective soft modulation unit 245₁,245₂,245₃,245₄.

Preferably, as illustrated, each D/R unit 205₁,205₂,205₃, 205₄ comprises a respective switching unit 250₁,250₂,250₃, 250₄ for switching the respective D/R unit 205₁,205₂,205₃, 205₄ between:

a first configuration (illustrated by dotted lines in the figure) wherein bit-level decoding (i.e., up to generate the soft bits) is performed through the soft demodulation $220_1,220_2,220_3,220_4$, buffer $225_{A1-A4}$, de-interleaver $230_1,230_2,230_3,230_4$ and decoder $235_1,235_2,235_3,235_4$ units, and bit-level regeneration from the soft bits is performed through the buffer $225_{B1-B4}$, interleaver $240_1,240_2,240_3,240_4$, and soft modulation $245_1,245_2,245_3,245_4$ units, and a second configuration (illustrated by solid lines in the figure) wherein symbol-level decoding (i.e., up to generate the soft symbols) is performed in the soft demodulation unit $220_1,220_2,220_3,220_4$, and symbol-level regeneration from the soft symbols is performed at the soft modulation unit $245_1,245_2,245_3,245_4$.

Preferably, as illustrated by arrow connection between each buffer unit $225_{B1},225_{B2},225_{B3},225_{B4}$ and the decoder unit $235_1,235_2,235_3,235_4$ of the respective D/R unit $205_1$, $205_2,205_3,205_4$, the buffer unit $225_{B1},225_{B2},225_{B3},225_{B4}$ is configured to store, at each iteration, the soft information from bit-level decoding of the respective component estimate $\ddot{d}_1^{it}, \ddot{d}_2^{it}, \ddot{z}_1^{it}, \ddot{z}_2^{it}$, so that at each iteration the D/R unit $205_1,205_2,205_3,205_4$ in the first configuration is arranged for carrying out said bit-level decoding also based on the most updated version of the soft information stored in the buffer unit $225_{A1},225_{A2},225_{A3},225_{A4}$ (e.g., the soft information of the previous iteration when consecutive iterations of bit-level decoding and regeneration are provided, or the soft information of the last iteration performed when non-consecutive iterations of bit-level decoding and regeneration are provided, as envisaged by the present invention).

Even more preferably, as illustrated by arrow connection between the buffer unit $225_{A1},225_{A2},225_{A3}, 225_{A4}$ and the soft demodulation unit $220_1,220_2,220_3,220_4$, symbol-level decoding of the respective component estimate $\ddot{d}_1^{it}, \ddot{d}_2^{it}, \ddot{z}_1^{it}, \ddot{z}_2^{it}$ (D/R unit $205_1,205_2,205_3,205_4$ in the second configuration) is also based on the most updated version of said soft information stored (at a previous iteration) in the buffer unit $225_{A1},225_{A2},225_{A3}, 225_{A4}$—similarly to the above, the most updated version of said soft information may be the soft information of the last iteration of bit-level decoding and regeneration performed on the respective signal component. A method of exchanging soft information between the decoder unit and the soft demodulator and using it as a priori information is described for example in the paper of S. T. Brink et Al, "*Iterative Demapping and Decoding for multilevel modulations*", IEEE 1998.

Finally, the receiver 200 may also comprise one or more (e.g., four) "Inverse Discrete Fourier Transform" units (hereinafter, IDFT units) $255_1,255_2,255_3,255_4$ for receiving the useful component estimate $\ddot{d}_1^{it}$, the useful component estimate $\ddot{d}_2^{it}$, the interfering component estimate $\ddot{z}_1^{it}$ and the interfering component estimate e, respectively, and for providing an Inverse Discrete Fourier Transformed version thereof to the soft demodulation units $220_1,220_2,220_3,220_4$, respectively, and one or more (e.g., four) "Discrete Fourier Transform" units (hereinafter, DFT units) $260_1,260_2,260_3$, $260_4$ for providing a Discrete Fourier Transformed version of the regenerated useful component estimate $\hat{d}_1^{it}$, of the regenerated useful component estimate $\hat{d}_2^{it}$, of the regenerated interfering component estimate $\hat{z}_1^{it}$ and of the regenerated interfering component estimate $\hat{z}_2^{it}$ to the interference canceller units $215_1,215_2,215_3,215_4$, respectively. Optional nature of the IDFT $255_1,255_2,255_3,255_4$ and DFT $260_1,260_2$, $260_3,260_4$ units, which is conceptually represented in the figure by dashed lines, may depend on specific design options. For example, the IDFT $255_1,255_2,255_3,255_4$ and DFT $260_1,260_2,260_3,260_4$ units may be omitted in case that a pure OFDM/OFDMA transmission technique is used, such as in the downlink transmission of the LTE system. Conversely, in the uplink transmission of the LTE system, where a DFT-precoded OFDM multiple access technique (also denoted as SC-FDMA) is used, provision of the IDFT $255_1,255_2,255_3,255_4$ and DFT $260_1,260_2,260_3,260_4$ units is recommended to compensate for the DFT precoding operation performed at the user equipment transmitter.

Briefly, the receiver 200 operates iteratively as follows:

1) At the first iteration (it=1) the weighting matrices Q and S, the component estimates $\hat{d}^0$ and $\hat{z}^0$ and the interference-free signal estimate $\{\hat{y}^{it,1}\ \hat{y}^{it,2}\ \tilde{y}^{it,1}\ \tilde{y}^{it,2}\}$ are initialized:

$$Q^1 = \begin{bmatrix} 1 & 0 \\ 0 & 1 \end{bmatrix} \quad Q_1^1 = \begin{bmatrix} 1 & 0 \\ 0 & 1 \end{bmatrix} \quad Q_2^1 = \begin{bmatrix} 1 & 0 \\ 0 & 1 \end{bmatrix} \quad S^1 = \begin{bmatrix} 1 & 0 \\ 0 & 1 \end{bmatrix}$$

$$S_1^1 = \begin{bmatrix} 1 & 0 \\ 0 & 1 \end{bmatrix} \quad S_2^1 = \begin{bmatrix} 1 & 0 \\ 0 & 1 \end{bmatrix}$$

$$\hat{d}_1^0 = 0 \quad \hat{d}_2^0 = 0 \quad \hat{z}_1^0 = 0 \quad \hat{z}_2^0 = 0$$

$$\hat{y}^{it,1} = \hat{y}^{it,2} = \tilde{y}^{it,1} = \tilde{y}^{it,2} = y$$

2) A first symbol estimate (i.e., the component estimate $\ddot{d}_1^{it}$, $\ddot{d}_2^{it}$, $\ddot{z}_1^{it}$, $\ddot{z}_2^{it}$) is obtained by means of the MMSE-IRC algorithm in the estimating units $210_1,210_2,210_3,210_4$ according to the above equations (i)-(iv).

3) The first symbol estimate $\ddot{d}_1^{it}$, $\ddot{d}_2^{it}$, $\ddot{z}_1^{it}$, $\ddot{z}_2^{it}$ is then subject to symbol-level demodulation and regeneration or to bit-level decoding and regeneration (according to the first or second configurations, respectively, of the switching units $250_1,250_2,250_3,250_4$). As a result of that, the regenerated symbols estimates $\hat{d}_1^{it}$, $\hat{d}_2^{it}$, $\hat{z}_1^{it}$, $\hat{z}_2^{it}$ are obtained.

4) The regenerated symbols estimates $\hat{d}_1^{it}$, $\hat{d}_2^{it}$, $\hat{z}_1^{it}$, $\hat{z}_2^{it}$ are then used to provide the interference-free signal estimates $\hat{y}^{it,2}$, $\hat{y}^{it,1}$, $\tilde{y}^{it,2}$, $\tilde{y}^{it,1}$ (without the MIMO inter-stream interference cancellation), according to the above equations (v)-(viii).

5) The iteration index it=it+1 is incremented and the weighting matrices updated as follows $$Q_1^{it} = \begin{bmatrix} 1 & 0 \\ 0 & \frac{\langle |s_2|^2\rangle - \langle |\hat{s}_2^{it}|^2\rangle}{\langle |s_2|^2\rangle} \end{bmatrix}, \quad Q_2^{it} = \begin{bmatrix} \frac{\langle |s_1|^2\rangle - \langle |\hat{s}_1^{it}|^2\rangle}{\langle |s_1|^2\rangle} & 0 \\ 0 & 1 \end{bmatrix},$$

$$Q^{it} = \begin{bmatrix} \frac{\langle |s_1|^2\rangle - \langle |\hat{s}_1^{it}|^2\rangle}{\langle |s_1|^2\rangle} & 0 \\ 0 & \frac{\langle |s_2|^2\rangle - \langle |\hat{s}_2^{it}|^2\rangle}{\langle |s_2|^2\rangle} \end{bmatrix}$$

$$S_1^{it} = \begin{bmatrix} 1 & 0 \\ 0 & \frac{\langle |z_2|^2\rangle - \langle |\hat{z}_2^{it}|^2\rangle}{\langle |z_2|^2\rangle} \end{bmatrix}, \quad S_2^{it} = \begin{bmatrix} \frac{\langle |z_1|^2\rangle - \langle |\hat{z}_1^{it}|^2\rangle}{\langle |z_1|^2\rangle} & 0 \\ 0 & 1 \end{bmatrix},$$

$$S^{it} = \begin{bmatrix} \frac{\langle |z_1|^2\rangle - \langle |\hat{z}_1^{it}|^2\rangle}{\langle |z_1|^2\rangle} & 0 \\ 0 & \frac{\langle |z_2|^2\rangle - \langle |\hat{z}_2^{it}|^2\rangle}{\langle |z_2|^2\rangle} \end{bmatrix}$$

wherein $\langle |z_1|^2\rangle = P_z$ and $\langle |z_2|^2\rangle = P_z$ are the average squared norms of the symbols transmitted by the interfering network node, thereafter operation of the receiver 200 goes back to step 2).

According to the present invention, the control unit CU is configured to perform a detection process (dedicated to the detection of the received signal, i.e. to the detection of the information bits of the respective useful signal components, and/or of the respective intra-cell interfering signal components and/or of the respective inter-cell interfering signal components) including a sequence of process steps, wherein:

the control unit CU determines activation or deactivation of each D/R unit $205_1, 205_2, 205_3, 205_4$ for each process step of the detection process;

for each process step, the control unit CU determines a respective number of allowed iterations for each D/R unit $205_1, 205_2, 205_3, 205_4$ (whose activation has been determined for that process step). The D/R units $205_1, 205_2, 205_3, 205_4$ to be activated (and, hence, the signal components to be processed) and each number of allowed iterations are determined according to radio measurements of the signal components (e.g. power measurements of the signal components, as discussed in the following) and such that an overall number of allowed iterations over the detection process does not exceed a maximum allowed number of iterations. Advantageously, although not necessarily, the maximum allowed number of iterations is indicative of at least one among an admitted throughput, an admitted latency and admitted energy consumption of the receiver 200.

Preferably, in the light of the considered receiver 200 architecture, the control unit CU is preferably further configured for determining, for each process step, the first or second configuration of each D/R unit $205_1, 205_2, 205_3, 205_4$ whose activation has been determined for that process step—or, otherwise stated, the control unit CU is configured for determining, for each process step, symbol-level or bit-level decoding and regenerations to be performed on each signal component intended to be processed at that process step. Even more preferably, the first or second configuration of each D/R unit $205_1, 205_2, 205_3, 205_4$ is determined according to the radio (e.g., power measurements) of the signal components (as discussed in the following).

Figure 3:
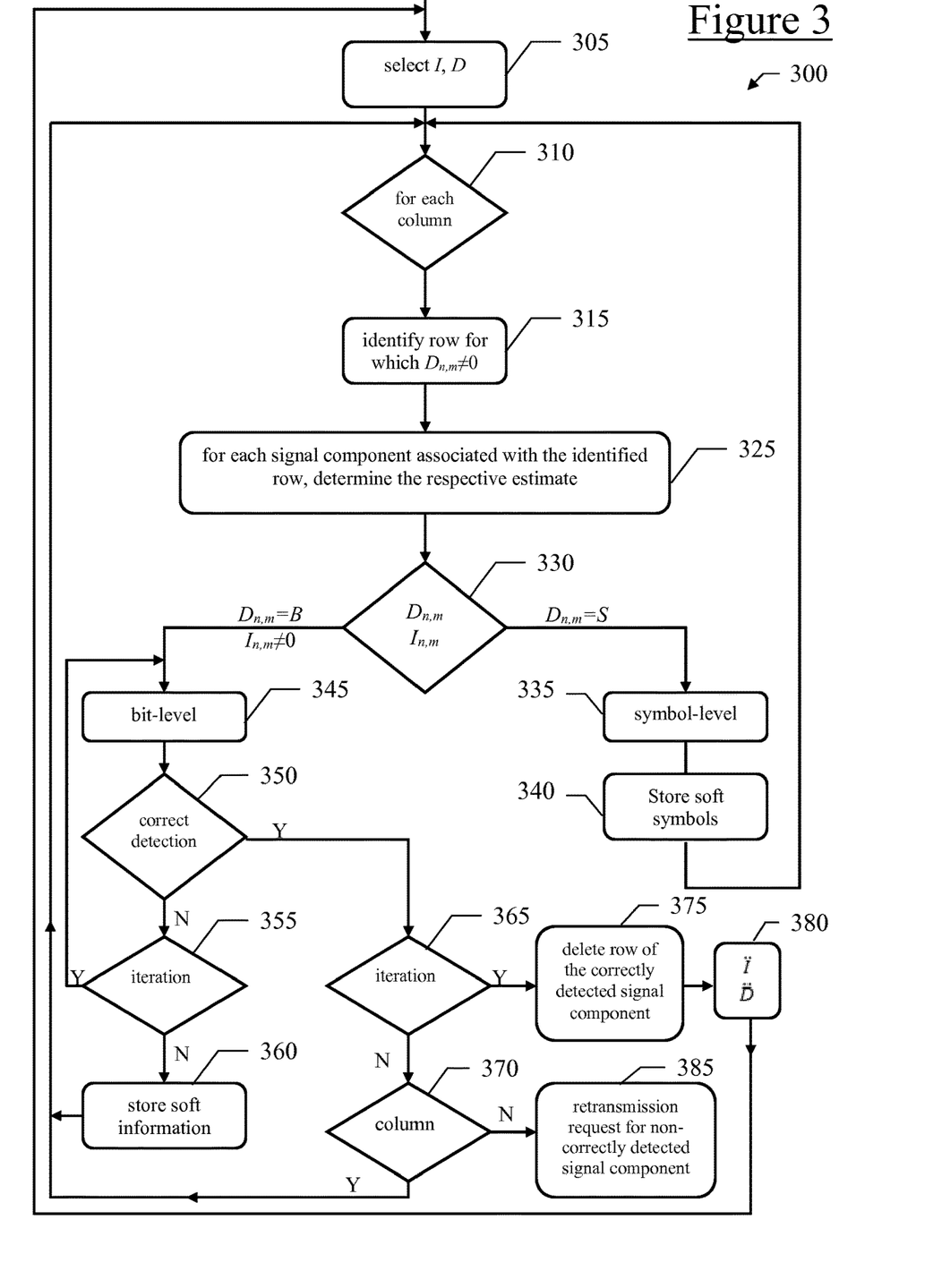

With reference now also to FIG. 3, it schematically shows an activity diagram illustrating a detection process 300 carried out by said receiver 200, for example under the control of the control unit CU, according an embodiment of the present invention.

The detection process 300 will be discussed by making reference to a practical and quantitative example.

For this example:
the application of the receiver 200 in the uplink (i.e. at the network node 105 side) is considered;
the network node 105 is assumed to be equipped with two receiving antennas and the user equipment 110 is assumed to be equipped with a single transmitting antenna;
a maximum allowed number of iterations $N_{iter}=16$ over the detection process is considered. According to embodiments of the present invention, the maximum allowed number of iterations $N_{iter}=16$ comprises both the number of iterations performed by the D/R units $205_1, 205_2, 205_3, 205_4$ when bit-level decoding and regeneration is enabled, and the number of iterations performed by the D/R units $205_2, 205_2, 205_3, 205_4$ when symbol-level decoding and regeneration is enabled. Advantageously, as herein assumed, $N_{iter}$ represents the maximum allowed number of iterations performed by the D/R units $205_1, 205_2, 205_3, 205_4$ only when bit-level decoding and regeneration is enabled (the symbol-level decoding and regeneration iterations being instead disregarded in this example). This is a reasonable approach, as the number of iterations of bit-level decoding and regeneration involves a same number of turbo decoding iterations, which the Applicant has identified as mostly affecting a receiver performance—on the contrary, the number of iterations of each D/R unit $205_1, 205_2, 205_3, 205_4$ when symbol-level decoding and regeneration is enabled does not significantly affect the performance of the receiver 200 and, moreover, a number of symbol-level decoding and regeneration iterations quite lower than the number of bit-level decoding and regeneration iterations is expected due to the lower capability of symbol-level decoding of significantly improving the decoding with the increasing of the number of consecutive iterations.

a number of signal components $N_C=4$ is considered. Among these four signal components, two signal components are assumed coming from two user equipment 110 served by the same network node 105 and scheduled on the same radio resources (useful signal components), whereas the other two components are assumed coming from other two user equipment served by adjacent network nodes that act as interfering user equipment for the considered network node 105 (interfering signal components).

According to an embodiment of the present invention, the operation of the receiver 200 is based on the following two matrices that, depending on the implementation, can be generated on the fly as a function of the radio measurements performed by the network node 105 or can be pre-computed and stored in a memory of the control unit CU:

a matrix I, with size $N_c \times N_{step}$, which determines the subdivision and the sequencing of the iterations among the different D/R units $205_1, 205_2, 205_3, 205_4$ ($N_{step}$ representing the number of process steps for each detection process). As the number of iterations is limited to $N_{iter}$, it follows that $1 \leq N_{step} \leq N_{iter}$. The condition $N_{step}=1$ occurs in the case that a pure "Parallel Interference Cancellation" scheme is chosen, wherein the four components are detected in parallel without interference cancellation and the $N_{iter}$ iterations are divided among the $N_c$ detection units so that $N_{iter}^{(1)} + N_{iter}^{(2)} + \ldots + N_{iter}^{(N_c)} = N_{iter}$, where $N_{iter}^{(i)}$ is the number of turbo decoding operations performed on the i-th component. The opposite case, namely $N_{step}=N_{iter}$, occurs in the case of a pure "Successive Interference Cancellation" scheme is chosen, wherein only one component is decoded, re-generated and cancelled using only one turbo decoding iteration. Each n-th row of the matrix I relates to a respective signal component, each m-th column of the matrix I relates to a specific process step of the detection process, and each entry of the matrix I represents the maximum number of turbo decoding iterations that, at the m-th process step, are allowed for those D/R units $205_1, 205_2, 205_3, 205_4$ whose activation, at that m-th process step, has been determined with bit-level decoding and regeneration enabled;

a matrix D, with size $N_c \times N_{step}$, which determines the type of decoding and regeneration (i.e., symbol-level or bit-level) to be performed on the considered signal component. Similarly to the matrix I, each n-th row of the matrix D relates to a respective signal component, each m-th column of the matrix D relates to a specific process step of the detection process, and the entries $D_{n,m}$ of the matrix D denote the type of decoding and regeneration. In the considered example, the entries $D_{n,m}$ of the matrix D may take the value "S" (indicating the symbol-level decoding and regeneration), the value "B" (indicating the bit-level decoding regeneration), or the value "0" (indicating no processing).

In order to describe the operation of the receiver 200, let the scenario be considered of a user equipment 110 at network cell $105_C$ edge, for which the signal-to-noise ratio is very low or even negative. The two matrices I and D applicable for this scenario may be, for example:

$$I = \begin{pmatrix} 0 & 0 & 2 & 0 & 0 & 0 & 4 \\ 0 & 2 & 0 & 0 & 0 & 4 & 0 \\ 0 & 0 & 0 & 2 & 0 & 0 & 0 \\ 0 & 0 & 0 & 0 & 2 & 0 & 0 \end{pmatrix}$$

$$D = \begin{pmatrix} 0 & 0 & B & 0 & 0 & 0 & B \\ 0 & B & 0 & 0 & 0 & B & 0 \\ S & 0 & 0 & B & 0 & 0 & 0 \\ S & 0 & 0 & 0 & B & 0 & 0 \end{pmatrix}$$

Thus, in this example, $N_{step}=7$ process steps have been initially planned.

As should be pointed out, the sum of the non-zero entries $I_{n,m}$ in the matrix I corresponds, by construction, to the maximum allowed number of iterations $N_{iter}$ that has been planned by taking into consideration computational complexity, energy consumption and/or latency constraints, i.e.:

$$\sum_{n=1}^{N_C=4} \sum_{m=1}^{N_{step}=7} I_{n,m} = N_{iter} = 16$$

As mentioned above, each n-th row of the matrices I and D relates to, or represents, a respective signal component. In the considered example, the first row is assumed to represent the useful signal component received at the serving network node 105, the second row is assumed to represent the signal component received at the serving network node 105 and directed toward a different user equipment 110 that operates in MU-MIMO, and the third and fourth rows are assumed to represent the interfering components received at the considered network node 105 from two user equipment served by distinct adjacent network nodes.

Back to the activity diagram, the detection process 300 operates as follows.

Firstly, the matrices I and D are selected (or computed) according to the radio measurements performed by the network node (action node 305), thereafter the matrices I and D are processed column by column (i.e., for each process step), as conceptually illustrated by the loop connection between the decision node 310 and the following nodes 340,360,370.

Then, for each m-th column of the matrix D, the rows are identified (action node 315) whose $D_{n,m}$ is different from 0 (indicating that either bit-level detection and regeneration, in case that $D_{n,m}$=B, or symbol-level detection and regeneration, in case that $D_{n,m}$=S, has been planned the corresponding signal components), thereafter the signal components corresponding to the identified rows are processed (concurrently in the current m-th process step), as follows.

For each identified row, and hence for each component to be processed in the current m-th process step, the respective component estimate $\ddot{d}_1^{it}, \ddot{d}_2^{it}, \ddot{z}_1^{it}, \ddot{z}_2^{it}$ is obtained (action node 325) by subtracting from the received signal $y=[y_1 \ y_2]^T$ the respective interference-free signal estimates ($\hat{y}^{it,2}, \hat{y}^{it,1}, \tilde{y}^{it,2}, \tilde{y}^{it,1}$) based on the most recent version of the (symbol-level or bit-level) regenerated signals that are input, as discussed above, to the respective interference canceller units $215_1, 215_2, 215_3, 215_4$. The fact that the soft symbols of each signal component at the soft-demodulator unit $220_1, 220_2, 220_3, 220_4$ output and the soft bits of each signal component at the decoder unit $235_1, 235_2, 235_3, 235_4$ output are preferably stored in the buffer units $225_{A1}, 220_{A2}, 220_{A3}, 220_{A4}$ and $225_{B1}, 225_{B2}, 225_{B3}, 225_{B4}$, respectively, makes it possible that the (symbol-level or bit-level) regenerated signals obtained in a previous process step are subtracted from the received signal $y=[y_1 \ y_2]^T$ even though in the current m-th process step the respective signal component is not processed.

Then, a check is performed at the decision node 330 for evaluating the type of processing (i.e., bit-level or symbol-level decoding and regeneration) to be performed on the considered signal component. As mentioned above, at each m-th process step the components are processed concurrently, so that, although not shown, the decision node 330 and the following nodes 335-385 should be replicated for each signal component to be processed.

If the entry $D_{n,m}$ of the considered n-th row (of the considered m-th column) is equal to S (see exit branch $[D_{n,m}=S]$ of the decision node 330), indicating that no turbo decoding iterations have been provided for the considered signal component, symbol-level processing is performed on the considered signal component (action node 335), preferably by using the a-priori information generated in a previous step (and stored in the buffer unit $225_{B1}, 225_{B2}, 225_{B3}, 225_{B4}$), thereafter the resulting soft symbols are stored (action node 340) in the buffer unit $225_{A1}, 225_{A2}, 225_{A3}, 225_{A4}$ of the D/R unit $205_1, 205_2, 205_3, 205_4$ handling that signal component, so as to be used for regeneration (as well as for following symbol-level or bit-level decoding). After that, and after the end of processing of the other signal components, the next column of the matrices I and D is considered (as conceptually indicated by arrow connection between the action node 340 and the decision node 310).

If instead the entry $D_{n,m}$ of the considered n-th row (of the considered m-th column) is equal to B (see exit branch $[D_{n,m}=B, I_{n,m}\neq 0]$ of the decision node 330), indicating that turbo decoding iterations have been provided for the considered signal component, bit-level processing is performed on the considered signal component (action node 345), preferably by using the a-priori information generated in a previous step (and stored in the buffer unit $225_{B1}, 225_{B2}, 225_{B3}, 225_{B4}$).

Preferably, at each turbo decoding iteration, correct detection of the processed signal component is checked (decision node 350), e.g. by using the "Cyclic Redundancy Code" associated with that signal component.

If, as a result of this check, the processed signal component is found to be not yet correctly detected (exit branch N of the decision node 350), and further turbo decoding iterations are still available for that signal component (as indicated by the respective entry $I_{n,m}$), exit branch Y of the decision node 355, another turbo decoding iteration is performed on the processed signal component (as indicated by loop connection between the decision node 355 and the action node 345).

If instead the processed signal component is found to be not yet correctly detected (exit branch N of the decision node 350), and no further turbo decoding iterations are still available for that signal component, exit branch N of the decision node 355, the soft information are stored in the respective buffer unit $\mathbf{225}_{B1},\mathbf{225}_{B2},\mathbf{225}_{B3},\mathbf{225}_{B4}$ (action node 360) so as to be used for regeneration in a subsequent process step, thereafter the next column of the matrices I and D is considered (as conceptually indicated by arrow connection between the action node 360 and the decision node 310).

Back to decision node 350, if, as a result of this check, the processed signal component is found to be correctly detected (exit branch Y of the decision node 350), and further turbo decoding iterations are still available for that component (as indicated by the respective entry $I_{n,m}$), exit branch Y of the decision node 365, a redistribution procedure is performed for distributing the saved iteration(s) among the remaining process steps (i.e., columns) and the remaining signal components to be processed (as detailed below).

If instead the processed signal component is found to be correctly detected (exit branch Y of the decision node 350), and no further turbo decoding iterations are available for that component, exit branch N of the decision node 365, and further columns to be processed are provided in the matrices I and D (exit branch Y of the decision node 370) the next column of the matrices I and D is considered (as conceptually indicated by arrow connection between the decision node 370 and the decision node 310).

If it is revealed that, at the considered m-th process step, the signal component is correctly detected with a lower number of turbo decoding iterations (with respect to the originally planned number of allowed iterations for that component at that m-th process step), the saved iteration(s) is/are made available by the control unit CU to the other pending signal component detections, and the remaining elements in the matrices I and D corresponding to the correctly detected component are deleted (action node 375).

As far as the redistribution phase is concerned, as mentioned above such a phase is run conditionally to the availability of turbo decoding iterations that have been saved in the previous process steps and can be redistributed to the pending signal component detections in the same detection process.

Let it be assumed, for example, that the signal components associated with the second and third rows of the matrices I and D have been correctly detected, then the second and third rows of the matrices I and D are deleted. The rearranged form of the matrices I and D (denoted by $\tilde{I}$ and $\tilde{D}$, respectively) after row deletion would be therefore the following:

$$\tilde{I} = \begin{pmatrix} 0 & 0 & 2 & 0 & 0 & 0 & 4 \\ 0 & 0 & 0 & 0 & 2 & 0 & 0 \end{pmatrix}$$

$$\tilde{D} = \begin{pmatrix} 0 & 0 & B & 0 & 0 & 0 & B \\ S & 0 & 0 & 0 & 0 & B & 0 \end{pmatrix}$$

Let be also assumed that $N_{inter}^{saved}=3$ turbo decoding iterations are still available.

The rearranged matrices $\tilde{I}$ and $\tilde{D}$ can be further compacted (action node 380) by deleting the process steps (i.e. columns) where no (bit-level) processing is performed (i.e. the null columns in the matrix $\tilde{I}$). By using this simplification rule the columns 1, 2, 4 and 6 can be deleted, and thus the matrices $\tilde{I}$ and $\tilde{D}$ are further compacted as follows:

$$\ddot{I} = \begin{pmatrix} 2 & 0 & 4 \\ 0 & 2 & 0 \end{pmatrix}$$

$$\ddot{D} = \begin{pmatrix} B & 0 & B \\ 0 & B & 0 \end{pmatrix}$$

The processing is then restarted considering the first column of the compacted matrix $\ddot{I}$ by trying to detect the first component with a maximum number of turbo decoding iterations equal to $\min(\ddot{I}_{1,1}, N_{iter}^{saved})=2$. In this way, redistribution of the available turbo decoding iterations (comprising both the turbo decoding iterations of the process steps not yet performed and the saved iteration(s) of the ended process steps) over the detection process is achieved.

Then, the detection process 300 goes back to action node 305, wherein the compacted matrices $\ddot{I}$ and $\ddot{D}$ are processed equivalently to the original matrices I and D.

Back to decision node 370, if, at the end of column processing (exit branch N of the decision node 370), no turbo decoding iterations are available (i.e., the maximum allowed number of iterations $N_{iter}$ has been reached), for the signal components that have not been successfully detected a retransmission request may be sent (action node 385) if the maximum number of retransmission of the H-ARQ procedure has not yet been reached.

In the considered practical example, the detection process operates as follows.

By looking at the first column of the matrices I and D, the two interfering components coming from the interfering user equipment ($3^{rd}$ and $4^{th}$ rows) are decoded in parallel at symbol-level ($I_{3,1}=I_{4,1}=0$ and $D_{3,1}=D_{4,1}=S$). The soft symbols at the soft-demodulator unit $\mathbf{220}_3, \mathbf{220}_4$ output are stored in the respective buffer unit $\mathbf{225}_{A3}, \mathbf{225}_{A4}$ and the corresponding re-generated component estimates $\hat{z}^{it}=[\hat{z}_1^{it}\ \hat{z}_2^{it}]^T$ are provided to the respective interference cancelling units $\mathbf{215}_3, \mathbf{215}_4$ for the subtraction in the subsequent process steps.

Considering the second column of the matrix I and D, the signal component coming from the second served user equipment ($2^{nd}$ row), intended for the co-scheduled MU-MIMO user, is detected at bit-level using a maximum of two iterations in the turbo decoding operation. The detection is performed using as input signal the received signal $y=[y_1\ y_2]^T$ from which the regenerated symbols $\hat{z}^{it}=[\hat{z}_1^{it}\ \hat{z}_2^{it}]^T$ obtained at the previous process step have been subtracted. If, by using the associated CRC ("Cyclic Redundancy Code"), it is revealed that the component is correctly detected with less than two turbo decoding iterations, the saved iteration(s) is made available by the control unit CU to the other pending signal component detections, and the remaining elements in the matrices I and D corresponding to the correctly detected component are deleted. Conversely, if after two decoding iterations the CRC is still in error, the soft information (i.e., the soft information and redundancy bits) at the turbo decoding unit $\mathbf{235}_2$ output are stored in the buffer unit $\mathbf{225}_{B2}$ in order to be able to regenerate the corresponding symbols $\hat{d}_2^{it}$ to be subtracted in the subsequent steps. The extrinsic part of the soft bits may be also stored in the buffer unit $\mathbf{225}_{B2}$ and used as a priori information for the turbo decoding unit $\mathbf{235}_2$ and/or the soft-demodulating unit $\mathbf{220}_2$ in case the processing of this signal component is resumed in a subsequent process step. In the case of this example this may occur at process step 6 where a further decoding of this signal component is attempted if the error-free decoding is not achieved in the current process step.

Considering the third column of the matrices I and D, the signal component coming from the first served user equipment 110 ($1^{st}$ row) is detected at bit-level using a maximum of two iterations in the turbo decoding operation. The detection is performed using as input signal the received signal $y=[y_1 \; y_2]^T$ from which the regenerated signals obtained in the process steps (1) and (2) have been subtracted. Again, if by using the associated CRC, it is revealed that the signal component is correctly detected with less or two turbo decoding iterations, the extracted information bits are provided to the upper protocol layers and the detection of this signal component can be considered concluded. The corresponding row in the matrices I and D is therefore deleted. Conversely, if after two turbo decoding iterations the CRC is still in error, the soft information at the turbo decoder unit 235$_1$ output are stored in the buffer unit 225$_{B1}$ in order to be able to regenerate the corresponding regenerated component estimate $\hat{d}_1^{it}$ to be subtracted in the subsequent steps. The extrinsic part of the soft information may be also stored in the buffer unit 225$_{B1}$ and used as a priori information for the turbo decoding 235$_1$ and/or the soft-demodulating 220$_1$ units when the processing of the this signal component is resumed in a subsequent step. In the case of this example this occurs at process step 7, where a further decoding of this signal component is attempted if the error-free decoding is not achieved in the current process step.

It should be noted that in case of application of the receiver 200 at the user equipment 110 side (i.e. in the downlink) only the useful signal component (associated with the first row of the matrices I and D) has to be successfully decoded. In this case then the detection process is stopped just when the CRC of this signal component is correct or if the last step of the detection procedure is reached. In the latter case, if the detection of this signal component is still in error, a retransmission request may be sent to the transmitter. More generally, as mentioned above, when the receiver 200 is used at user equipment 110 side, the detection process of each decoding and regenerating unit 205$_1$, 205$_2$,205$_3$,205$_4$ is stopped when correct detection of the signal component from the network node 105 serving the user equipment 110 and directed to the user equipment 110 is determined, whereas when the receiver 200 is used at network node 105 side, the detection process of each decoding and regenerating unit 205$_1$,205$_2$,205$_3$,205$_4$ is stopped when correct detection of each signal component from any user equipment served by that network node 105 and directed towards said network node 105 is determined.

Back to the practical example, considering the fourth column of the matrices I and D, the signal component coming from the first interfering user equipment (3rd row) is detected at bit-level by using a maximum of two turbo decoding iterations. The detection is performed using as input signal the received signal $y=[y_1 \; y_2]^T$ from which the regenerated symbols obtained in the process steps (3), (2) and (1)—namely, $\hat{d}_1^{it}$, $\hat{d}_2^{it}$ and $\hat{z}_2^{it}$, respectively—have been subtracted. Also in this case, if the signal component is correctly detected with less than two turbo decoding iterations, the saved iteration(s) is made available by the control unit CU to the other pending signal component detections.

Considering the fifth column of the matrices I and D, the signal component of the second interfering user equipment is processed ($4^{th}$ row). The corresponding signal component is detected at bit-level by using a maximum of two turbo decoding iterations. The detection is performed by using as input signal the received signal $y=[y_1 \; y_2]^T$ from which the regenerated signals obtained in the process steps (4), (3) and (2) have been subtracted. Also in this case, if the signal component is correctly detected with less than two turbo decoding iterations, the saved iteration(s) is made available by the control unit CU to the other pending signal component detections.

Considering the sixth column of the matrices I and D, the signal component coming from the second served user equipment ($2^{nd}$ row) is detected at bit-level using a maximum of four turbo decoding iterations. The detection is performed using as input signal the received signal $y=[y_1 \; y_2]^T$ from which the regenerated signals obtained in the process steps (5), (4) and (3) have been subtracted. Also in this case if the signal component is correctly detected with less than four turbo decoding iterations, the saved iteration(s) can be made available by the control unit CU to the other pending tasks.

Considering the seventh column of the matrices I and D, the signal component coming from the first served user equipment ($1^{st}$ row) is detected at bit-level using a maximum of four turbo decoding iterations. The detection is performed using as input signal the received signal $y=[y_1 \; y_2]^T$ from which the regenerated signals obtained in the process steps (6), (5) and (4) have been subtracted.

As mentioned before, the matrices I and D applicable for a given scenario can be determined as a function of the radio measurements performed by the receiver 200.

The radio measurements may include for example the power of the received signal components (denoted by $\{P_r^{CW1} \; P_r^{CW2} \; P_r^{CW3} \; P_r^{CW4}\}$, respectively).

Using the received powers it can be decided the detection order and the number of turbo decoding iterations to be used for each signal component. In case of a signal component that shows a significant higher power (e.g., with a power difference $\Delta=4$ dB or more) compared to the other ones, it can be processed by first using a symbol-level decoding and re-generation (at least in the first step). For example assuming that $$P_r^{CW1} \geq \Delta + P_r^{CW2}$$

$$P_r^{CW1} \geq \Delta + P_r^{CW3}$$

$$P_r^{CW1} \geq \Delta + P_r^{CW4}$$

the first column of the matrices I and D would be as follows $$I = \begin{pmatrix} 0 \\ 0 \\ 0 \\ 0 \end{pmatrix} \cdots$$

$$D = \begin{pmatrix} S \\ 0 \\ 0 \\ 0 \end{pmatrix} \cdots$$

In another case where two of the received signal components have similar received powers but significantly higher compared to the other ones, they can be processed in parallel at symbol-level (at least in the first step). For example assuming that $$P_r^{CW1} \approx P_r^{CW2}$$

$$P_r^{CW1} \geq \Delta + P_r^{CW3}$$

$$P_r^{CW1} \geq \Delta + P_r^{CW4}$$

the first column of the matrices I and D would be as follows $$I = \begin{pmatrix} 0 \\ 0 \\ 0 \\ 0 \end{pmatrix} \cdots$$

$$D = \begin{pmatrix} S \\ S \\ 0 \\ 0 \end{pmatrix} \cdots$$

In another case where the four received signal components have similar received powers, the four signal components could be processed in a first parallel step at bit-level using a PIC strategy and a limited number of iterations for each signal component, sufficient to get a relative accurate signal regeneration. After that, each signal component could be sequentially detected using a SIC strategy starting from the strongest one to the weakest one (i.e., from the signal component having the highest power to the signal component having the lowest power). For example, assuming that $$P_r^{CW1} \approx P_r^{CW2} \approx P_r^{CW3} \approx P_r^{CW4}$$

and $$P_r^{CW1} > P_r^{CW2} > P_r^{CW3} > P_r^{CW4}$$

the structure of the matrices I and D would be as follows (assuming $N_{iter}=16$)

$$I = \begin{pmatrix} 2 & 2 & 0 & 0 & 0 \\ 2 & 0 & 2 & 0 & 0 \\ 2 & 0 & 0 & 2 & 0 \\ 2 & 0 & 0 & 0 & 2 \end{pmatrix}$$

$$D = \begin{pmatrix} B & B & 0 & 0 & 0 \\ B & 0 & B & 0 & 0 \\ B & 0 & 0 & B & 0 \\ B & 0 & 0 & 0 & B \end{pmatrix}$$

In general, the matrices I and D are computed according to a detection strategy (an example of which has just been discussed).

According to an embodiment of the present invention, a set of detection strategies is stored in the receiver 200 (e.g., in the control unit CU memory), and the most appropriate strategy is selectively activated as a function of the radio measurements performed by the receiver 200.

According to an alternative embodiment of the present invention, different detection strategies are cyclically tested by the receiver 200 (e.g. with each detection strategy that is applied in a different set of sub-frames) during a learning phase. For each detection strategy the performance in terms of a specific metric (e.g., throughput, latency, energy consumption) is collected, thereafter the strategy that best satisfies the considered metric is selected. The learning phase can be periodically activated or triggered by events such for example the change in the level of interference or in the number of dominant interfering signals.

According to a different embodiment of the present invention, the receiver 200 may implement a "backtracking" mechanism wherein the detection strategy is smoothly and autonomously modified by the receiver 200 in order to optimize the selected metric. The smooth modification of the detection strategy may consist in changing the order in the detection of the different signal components and in the division of the fixed complexity budget among the different detections. These changes may be performed by the receiver 200 and its effective application may be decided by observing its effect on the considered performance metric (e.g., throughput, latency, energy consumption). If the change in the detection strategy has a positive effect on the metric, the detection strategy is applied, otherwise a step back is done and a different change in the detection strategy is attempted.

The present receiver 200 flexibly allows any detection strategy ranging from parallel decoding of useful and/or interference signal components (e.g., "Parallel Interference Cancellation" scheme), successive decoding of useful and/or interference signal components (e.g., "Successive Interference Cancellation" scheme) or any combination thereof.

Naturally, in order to satisfy local and specific requirements, a person skilled in the art may apply to the solution described above many logical and/or physical modifications and alterations. More specifically, although the present invention has been described with a certain degree of particularity with reference to preferred embodiments thereof, it should be understood that various omissions, substitutions and changes in the form and details as well as other embodiments are possible. In particular, different embodiments of the invention may even be practiced without the specific details set forth in the preceding description for providing a more thorough understanding thereof on the contrary, well-known features may have been omitted or simplified in order not to encumber the description with unnecessary details. Moreover, it is expressly intended that specific elements and/or method steps described in connection with any disclosed embodiment of the invention may be incorporated in any other embodiment as a matter of general design choice.

More specifically, analogous considerations apply if the receiver has a different structure or comprises equivalent components, or it has other operating features. In any case, any component thereof may be separated into several elements, or two or more components may be combined into a single element; in addition, each component may be replicated for supporting the execution of the corresponding operations in parallel. It should also be noted that any interaction between different components generally does not need to be continuous (unless otherwise indicated), and it may be both direct and indirect through one or more intermediaries.

In addition, although explicit reference has been made to wireless communication network based on the LTE/LTE-Advanced standard, it should be understood that it is not in the intentions of the Applicant to be limited to the implementation of any particular wireless communication system architecture or protocol.

In addition, although explicit reference has been made to a wireless communication network based on OFDM technique, the present invention can also be applied in wireless communication networks making use of different multiple access techniques, such as "Code Division Multiple Access" (CDMA) technique.

Moreover, the solution according to an embodiment of the invention lends itself to be implemented through an equivalent method (by using similar steps, removing some steps being not essential, or adding further optional steps). Moreover, the steps may be performed in different order, concurrently or in an interleaved way (at least partly).

The invention claimed is:

1. A receiver, the receiver comprising:
at least one estimating unit for receiving a signal and for providing an estimate of each signal component,
at least two decoding and regenerating units, at each iteration, each decoding and regenerating unit decoding a respective one estimate among the estimates, and regenerating the respective decoded estimate into a respective regenerated estimate, wherein, at each iteration of the receiver, the at least one estimating unit provides the estimates based on the regenerated estimates provided at a previous iteration, wherein each decoding and regenerating unit comprises a switching unit for switching the respective decoding and regenerating unit between a first configuration wherein bit-level decoding is performed and a second configuration wherein symbol-level decoding is performed, and
a control unit for determining activation or deactivation of each decoding and regenerating unit at each process step of a detection process dedicated to detection of the signal, and for determining, for each process step, a respective number of allowed iterations for each decoding and regenerating unit whose activation has been determined for that process step, each number of allowed iterations being determined according to radio measurements of the signal components and such that an overall number of allowed iterations over the detection process does not exceed a maximum allowed number of iterations, wherein the control unit is configured to determine, for each process step, the first or second configuration of each decoding and regenerating unit whose activation has been determined for that process step.

2. The receiver according to claim 1, wherein the maximum allowed number of iterations is based on at least one among an admitted throughput, an admitted latency and an admitted energy consumption of the receiver.

3. The receiver according to claim 1, wherein each decoding and regenerating unit further comprises a respective buffer unit for storing, at each iteration, soft information from bit-level decoding of the respective estimate, and at each iteration, each decoding and regenerating unit in the first configuration configured to execute the bit-level decoding based on a most updated version of the soft information.

4. The receiver according to claim 3, wherein each decoding and regenerating unit in the second configuration is configured to execute the symbol-level decoding based on a most updated version of the soft information.

5. The receiver according to claim 1, wherein the control unit is further configured to determine, at each iteration of an activated decoding and regenerating unit, correct detection of the respective signal component, and in a case that correct detection of the signal component with a lower number of allowed iterations is determined, distribute the number of allowed iterations among the remaining signal components to be detected over the same detection process.

6. The receiver according to claim 5, wherein in a case that, at an end of the detection process, incorrect detection of at least one signal component of the signal components is determined, the control unit is further configured to send a re-transmission request for the incorrectly detected at least one signal component.

7. The receiver according to claim 5, wherein the control unit is configured to determine, at each iteration, correct signal detection according to a cyclic redundancy code (CRC) associated with the signal component.

8. The receiver according to claim 1, wherein the receiver is configured to be used at a user equipment side of a wireless communication network, the control unit being further configured to stop the detection process of each decoding and regenerating unit for the received signal based on determining correct detection of each signal component from a network node serving the user equipment and directed to the user equipment.

9. The receiver according to claim 1, wherein the receiver is configured to be used at a network node side of a wireless communication network, the control unit being further configured to stop the detection process of each decoding and regenerating unit for the received signal based on determining correct detection of each signal component from any user equipment served by the network node and directed towards the network node.

10. The receiver according to claim 1, wherein the radio measurements comprise power measurements of the signal components.

11. The receiver according to claim 1, wherein the at least one estimating unit is based on an MMSE-Interference Rejection Combining (MMSE-IRC) algorithm.

12. A method comprising:
receiving a signal including useful and interfering signal components, and providing an estimate of each signal component,
at each process step of a detection process intended to detect information carried on the signal, processing at least one signal component by iteratively decoding the respective estimate and regenerating the respective decoded estimate into a respective regenerated estimate, wherein, at each iteration, the providing the estimates is based on the regenerated estimates provided at a previous iteration, and wherein the iterative decoding and regenerating are performed by at least two decoding and regenerating units, wherein each decoding and regenerating unit comprises a switching unit for switching the respective decoding and regenerating unit between a first configuration wherein bit-level decoding is performed and a second configuration wherein symbol-level decoding is performed, and
determining, by a control unit and for each process step of the detection process, the at least one signal component to be processed and a number of allowed iterations for each signal component intended to be processed at that process step, each number of allowed iterations being determined according to radio measurements of the signal components and such that an overall number of allowed iterations over the detection process does not exceed a maximum allowed number of iterations, wherein the control unit being configured to determine, for each process step, the first or second configuration of each decoding and regenerating unit whose activation has been determined for that process step.

13. The method according claim 12, further comprising determining, for each process step, a bit-level decoding or a symbol-level decoding for each signal component intended to be processed at that process step.

14. The method according to claim 12, further comprising determining, at each iteration, correct detection of the respective signal component, and
in a case that correct detection of the signal component with a lower number of allowed iterations is determined, distributing the number of allowed iterations among the remaining signal components to be detected over the same detection process.

* * * * *